(12) United States Patent
Kihara et al.

(10) Patent No.: US 8,531,177 B2
(45) Date of Patent: Sep. 10, 2013

(54) TIMING DETECTION DEVICE

(75) Inventors: Noriaki Kihara, Musashino (JP);
Shunsuke Hayashi, Musashino (JP);
Kenji Habaguchi, Musashino (JP);
Takayuki Ooshima, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 338 days.

(21) Appl. No.: 12/882,727

(22) Filed: Sep. 15, 2010

(65) Prior Publication Data

US 2011/0062943 A1 Mar. 17, 2011

(30) Foreign Application Priority Data

Sep. 15, 2009 (JP) .................................. 2009-213393

(51) Int. Cl.
*G01R 23/02* (2006.01)
(52) U.S. Cl.
USPC .................. 324/76.39; 324/76.35; 324/76.59; 324/333; 324/356; 330/254; 375/293
(58) Field of Classification Search
USPC ............. 324/76.39, 76.35, 76.53, 76.59, 333, 324/356
See application file for complete search history.

(56) References Cited

U.S. PATENT DOCUMENTS

| 3,947,769 | A | 3/1976 | Rousos et al. |
| 4,888,790 | A * | 12/1989 | Wong et al. .................... 375/293 |
| 2007/0126507 | A1 * | 6/2007 | Sakura .......................... 330/254 |
| 2009/0322379 | A1 * | 12/2009 | Tomita ........................... 327/58 |

FOREIGN PATENT DOCUMENTS

| EP | 0581455 A1 | 2/1994 |
| JP | 64-071316 A | 3/1989 |
| JP | 04054791 A * | 2/1992 |
| JP | 10-038931 A | 2/1998 |
| JP | 2005-203006 A | 7/2005 |

OTHER PUBLICATIONS

Japanese Office Action dated Aug. 8, 2011, issued in corresponding Japanese Patent Application No. 2009-213393.
European Search Report dated Feb. 28, 2012, issued in corresponding European Patent Application No. 10176723.4.

* cited by examiner

*Primary Examiner* — Arleen M Vazquez
*Assistant Examiner* — Son Le
(74) *Attorney, Agent, or Firm* — Westerman, Hattori, Daniels & Adrian, LLP

(57) ABSTRACT

A timing detection device includes a draw back amount acquiring unit and a detecting unit. The draw back amount acquiring unit is configured to acquire a draw back amount of a received signal with respect to a peak value of the signal. The detecting unit is configured to detect the timing at which the draw back amount acquired by the draw back amount acquiring unit has exceeded a constant value as the timing at which a value of the signal is switched.

5 Claims, 10 Drawing Sheets

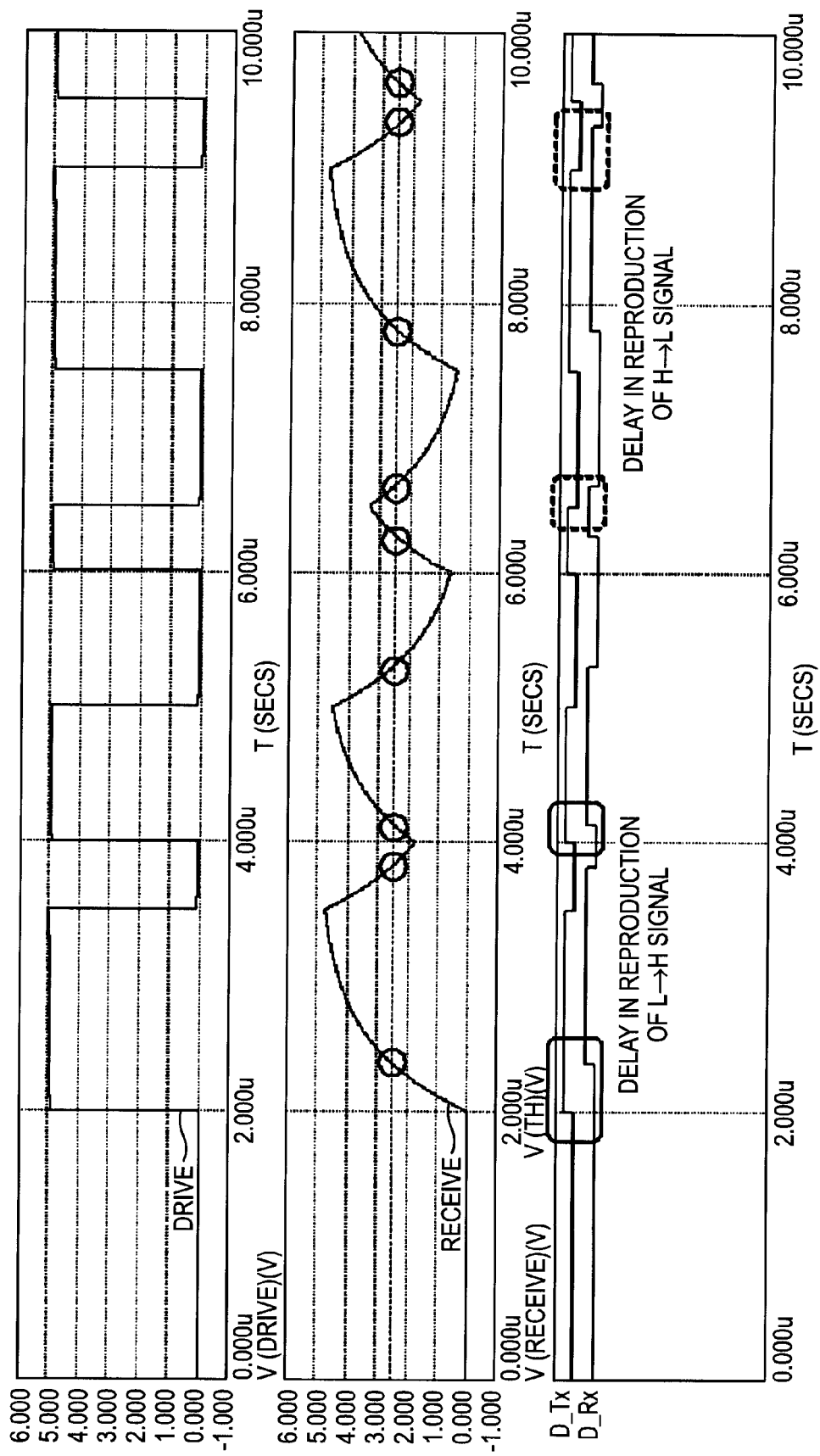

TIMING DETECTION DEVICE

TECHNICAL FIELD

The present disclosure relates to a timing detection device for detecting the timing at which the value of a received signal is switched on the basis of the received signal.

RELATED ART

A transmission line for transmitting communication signals has a frequency characteristic, and a communication signal passing therethrough is affected by attenuation distortion, phase (delay) distortion, for example. Attenuation distortion is generated because the degree of the attenuation of a signal having a frequency band is different depending on frequency. Phase distortion is generated because the phase of a signal does not directly relate to the frequency thereof, that is, group propagation time is different depending on the frequency. In the case of simple communication, a base-band system is used occasionally for modulation and demodulation to reduce circuit cost. For example, RS-232 in which only a start bit and a stop bit are added to a serial data sequence is taken as an example thereof. However, in that case, there is no other choice but to use a low bit rate hardly affected by the transmission line or to shorten the transmission line.

PRIOR ART DOCUMENT

Patent Document

Patent document 1: Japanese Patent Application Laid-open Publication No. Sho 64-71316

FIGS. 9A and 9B are graphs showing waveforms obtained when a pulse signal having an amplitude of 5 V is transmitted through a transmission line. FIG. 9A shows a case in which the transmission line is short and FIG. 9B shows another case in which the transmission line is long.

In each of FIG. 9A and FIG. 9B, a transmitted waveform (Drive) is shown in the upper part thereof, and a received waveform (Receive) is shown in the lower part thereof. When the pulse signal is reproduced while the center potential (2.5 V) of the amplitude of the voltage of the pulse signal on the reception side is used as a threshold, a phenomenon is observed in which a short pulse following a long pulse becomes narrower, and conversely a long pulse following a short pulse becomes wider. Although the change in the width of a pulse is not so noticeable in FIG. 9A, the width of a pulse transmitted from the transmission side through the long transmission line shown in FIG. 9B is hardly capable of being reproduced accurately on the reception side. This occurs because the time difference between a transmitted pulse signal (D_Tx) and a received pulse signal (D_Rx) depends on the pulse shape in an L→H transition timing (timing of transition from L to H) and in an H→L transition timing (timing of transition from H to L) and is not constant as shown in FIG. 9B. In the case that the pulse width cannot be reproduced as described above, a serial data sequence or the like cannot be transmitted properly.

SUMMARY

Exemplary embodiments of the present invention provide a timing detection device capable of accurately reproducing the pulse width of a signal.

A timing detection device according to an exemplary embodiment of the invention comprises:

a draw back amount acquiring unit configured to acquire a draw back amount of a received signal with respect to a peak value of the signal; and a detecting unit configured to detect the timing at which the draw back amount acquired by the draw back amount acquiring unit has exceeded a constant value as the timing at which a value of the signal is switched.

With this timing detection device, the timing at which the draw back amount of the signal from the peak value thereof has exceeded the constant value is detected as the timing at which the value of the signal is switched, whereby the deviation widths of the detected timings are stabilized, and the pulse widths of the signal can be reproduced accurately.

The timing detection device further comprises:

a delay unit configured to delay a restart time of a detection operation of the detecting unit by the time when a constant time passes from the time when the timing at which the value of the signal is switched is detected by the detecting unit.

In the timing detection device, the draw back amount acquiring unit includes a peak hold circuit configured to hold the peak value, and the detecting unit detects the timing at which a difference between the peak value held by the peak hold circuit and the value of the signal has exceeded the constant value as the timing at which the value of the signal is switched.

In the timing detection device, the draw back amount acquiring unit include an extracting circuit configured to extract a movement of the signal, and the detecting unit detects the timing at which the movement extracted by the extracting circuit has exceeded the constant value as the timing at which the value of the signal is switched.

In the timing detection device, the extracting circuit includes a clamper circuit configured to cancel a DC offset of the signal and extract the movement and a capacitor configured to absorb the DC offset canceled by the clamper circuit.

With the timing detection device according to the present invention, the timing at which the draw back amount of the signal from the peak value thereof has exceeded the constant value is detected as the timing at which the value of the signal is switched, whereby the deviation widths of the detected timings are stabilized, and the pulse widths of the signal can be reproduced accurately.

BRIEF DESCRIPTION OF THE DRAWINGS

FIG. 9A is a view showing a waveform in a case in which the transmission line is short and FIG. 9B is a view showing a waveform in a case in which the transmission line is long.

DETAILED DESCRIPTION

Next, exemplary embodiments of a timing detection device according to the present invention will be described below.

Embodiment 1

A timing detection device according to Embodiment 1 will be described below.

Figure 1:
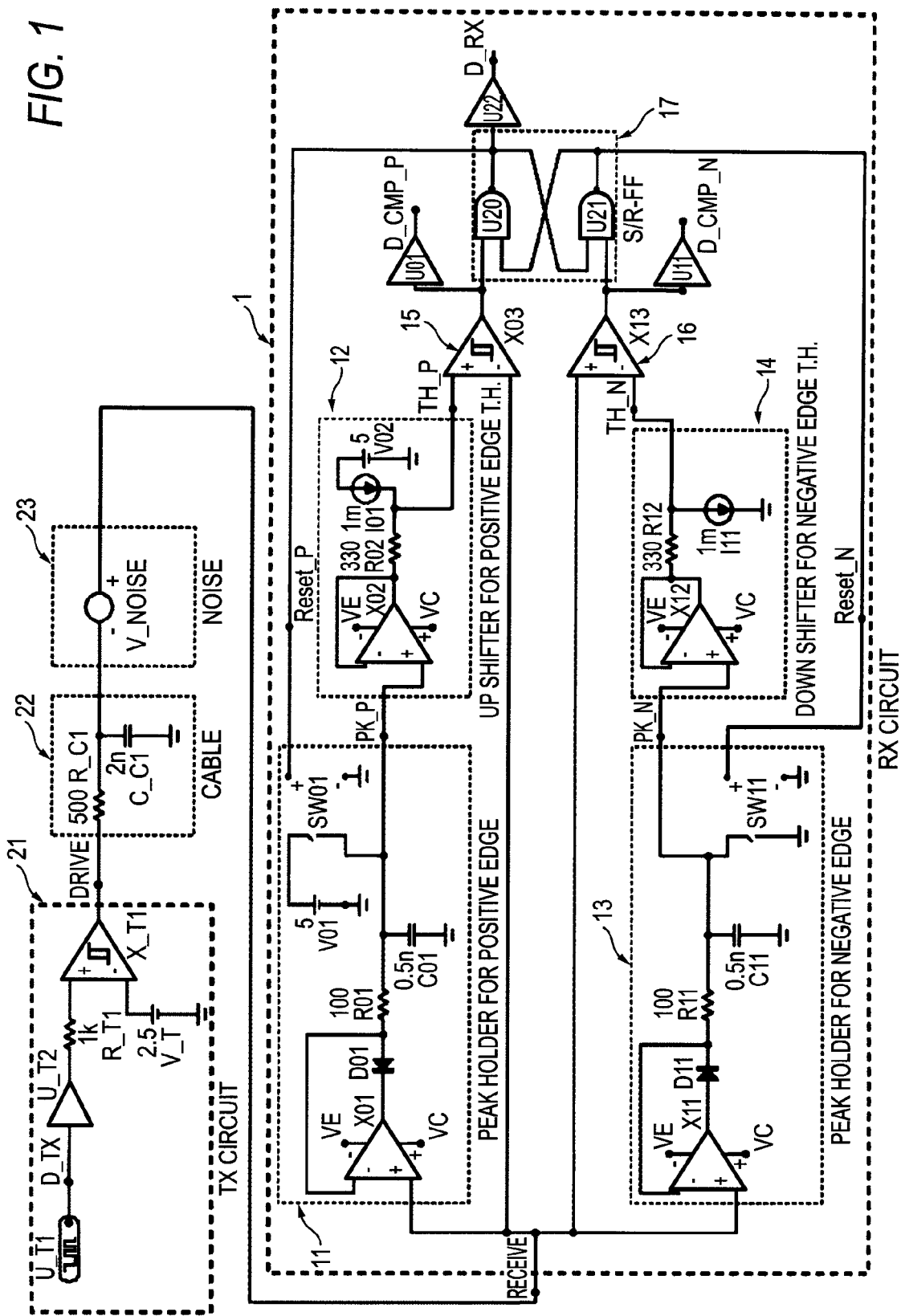
FIG. 1 is a view showing the configuration of a timing detection device according to Embodiment 1.

FIG. 1 is a view showing the configuration of the timing detection device according to Embodiment 1.

As shown in FIG. 1, a timing detection device 1 according to this embodiment includes a peak hold circuit 11, a level shift circuit 12, a peak hold circuit 13, a level shift circuit 14, a comparator 15, a comparator 16 and a flip-flop 17.

The peak hold circuit 11 is a peak hold circuit having a general configuration and is used to hold the minimum value of an immediately preceding waveform to find the rising edge of a pulse. The level shift circuit 12 receives an output voltage (PK_P) from the peak hold circuit 11 and generates a voltage (TH_P) higher than the output voltage by a constant level. The shift amount of the level shift circuit 12 is determined by a constant current circuit I01 and a resistor R02.

The peak hold circuit 13 is a peak hold circuit having a general configuration and is used to hold the maximum value of an immediately preceding waveform to find the falling edge of a pulse. The level shift circuit 14 receives an output voltage (PK_N) from the peak hold circuit 13 and generates a voltage (TH_N) lower than the output voltage by a constant level. The shift amount of the level shift circuit 14 is determined by a constant current circuit I11 and a resistor R12.

The comparator 15 compares the level of an input signal voltage (Receive) with the level of a threshold (TH_P), and the comparator 16 compares the level of the input signal voltage (Receive) with the level of a threshold (TH_N). The flip-flop 17 is set or reset depending on the result of the comparison. The switch SW01 of the peak hold circuit 11 or the switch SW11 of the peak hold circuit 13 is turned ON depending on the state of the flip-flop 17, whereby one of the two peak hold circuits 11 and 13 is reset.

In FIG. 1, a transmitting circuit 21, a cable 22 and a noise mixer 23 are circuits used for the simulation of the timing detection device 1 and generate the input signal voltage (Receive) that is applied to the timing detection device 1.

Figure 2:
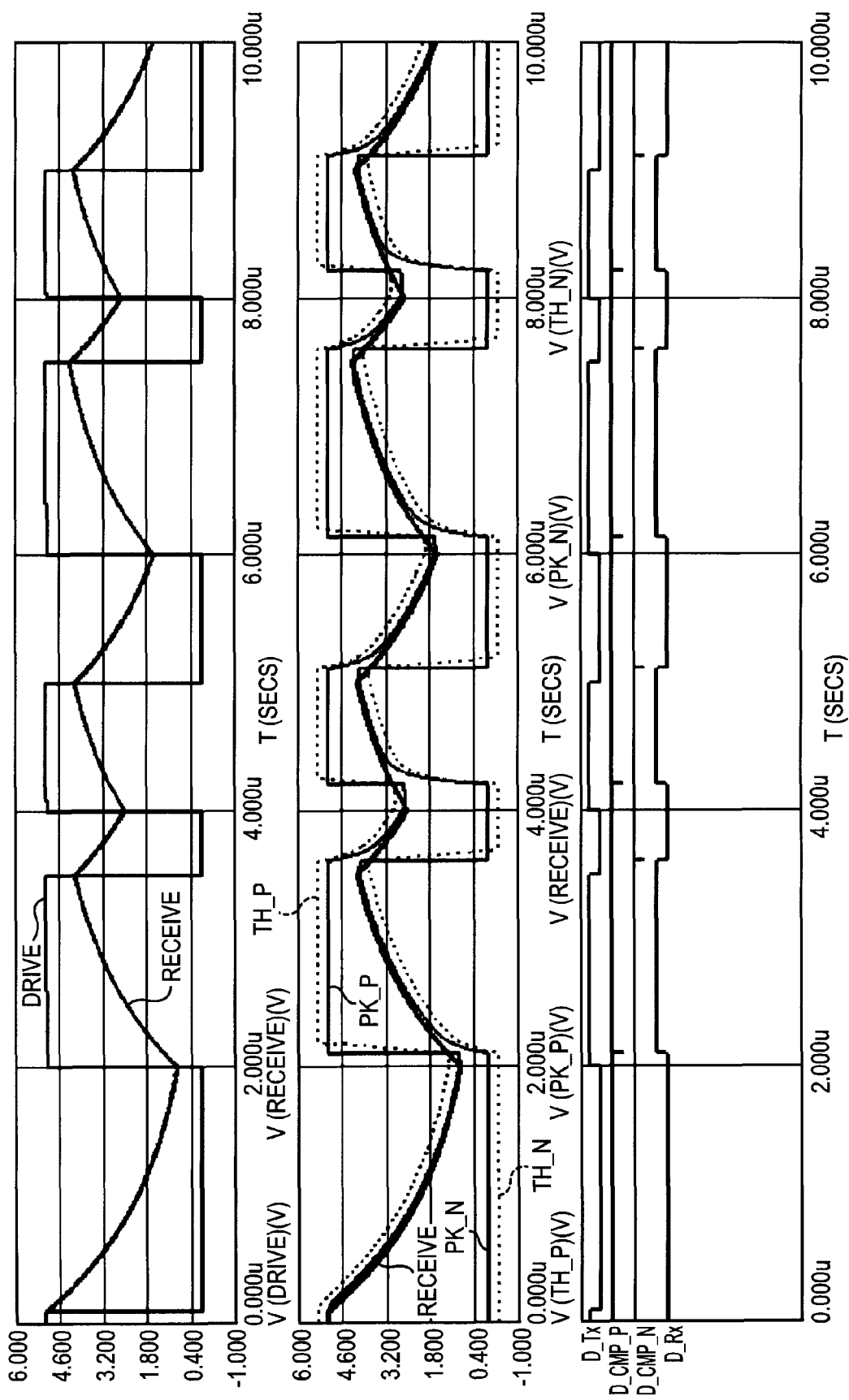
FIG. 2 is a graph showing voltages at various portions of the circuits in the timing detection device according to the Embodiment 1.

FIG. 2 is a graph showing voltages at various portions of the circuits in the timing detection device 1 shown in FIG. 1.

Although the signal voltage (Drive) based on a transmitted pulse signal (D_TX) and delivered from the transmitting circuit 21 has a square waveform, the signal voltage, i.e., a pulse signal, is distorted while being transmitted through the cable 22 and is observed as the voltage (Receive) on the reception side. In FIG. 2, the thresholds (TH_P and TH_N) are indicated by broken lines. When the waveform of the received signal voltage (Receive) intersects one of the thresholds, the polarity of the output (D_COMP_P or D_COMP_N) of the corresponding comparator 15 or 16 is inverted to negative. As a result, the output of the flip-flop 17 is inverted, and the states of the peak hold circuits 11 and 13 are reset to the opposite states thereof. Furthermore, the output of the flip-flop 17 is detected as a received pulse signal (D_RX).

Figure 3:
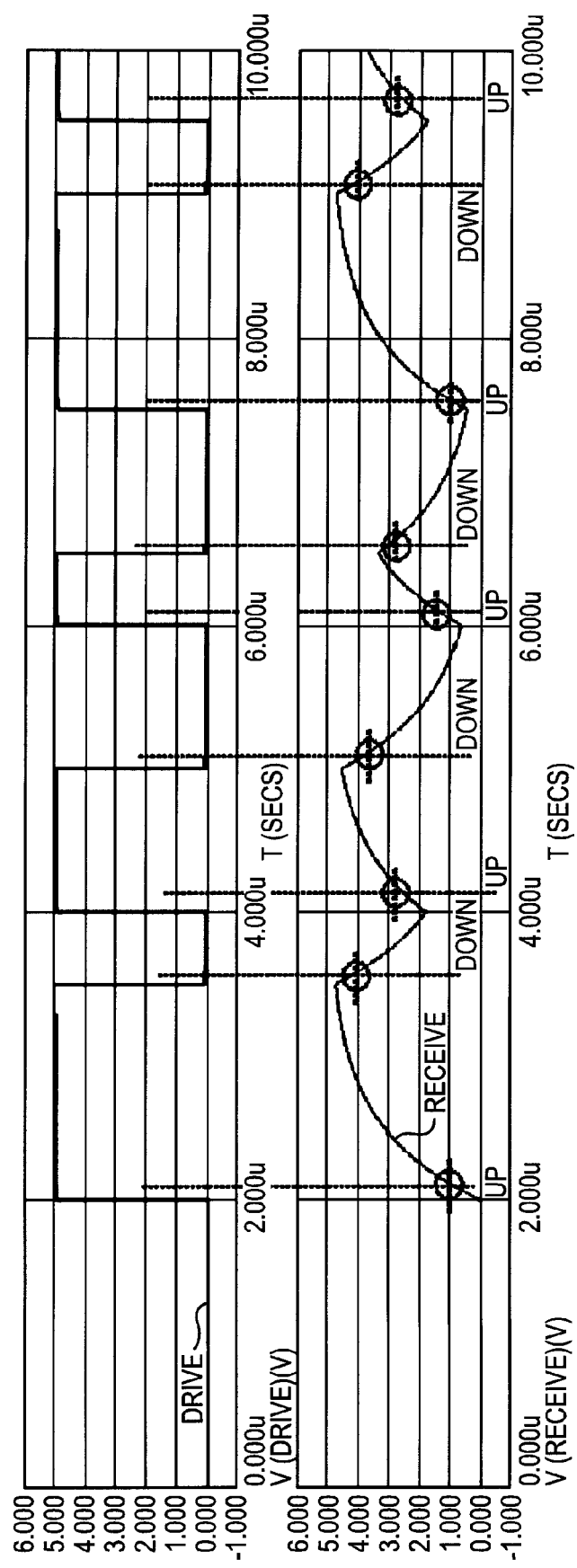
FIG. 3 is a graph showing the rising timing and the falling timing of the received pulse signal (D_RX).

FIG. 3 is a graph showing the rising timing and the falling timing of the received pulse signal (D_RX). As shown in FIGS. 1 and 2, when the received pulse signal (D_RX) rises, the threshold (TH_P) indicates a voltage higher than the negative peak value of the received input signal voltage (Receive) by a constant level. When the received pulse signal (D_RX) falls, the threshold (TH_N) indicates a voltage lower than the positive peak value of the input signal voltage (Receive) by a constant level. Hence, the rising timing and the falling timing of the received pulse signal (D_RX) are each detected at the time when the input signal voltage (Receive) is attenuated from the peak value by the constant level (more specifically, at the time when the input signal voltage (Receive) is higher than the negative peak value by the constant level or is lower than the positive peak value by the constant level). Referring to FIGS. 2 and 3, it can be understood that the received pulse signal (D_RX) is generated while being delayed from the transmitted pulse signal (D_TX) by a nearly constant delay time and that the received pulse signal (D_RX) properly reflects the changing points and the pulse widths of the transmitted pulse signal (D_TX).

As described above, in this embodiment, the edges of the transmitted waveform are detected using the peaks of the input signal voltage (Receive). More specifically, the level of each of the thresholds is made variable and dynamically set to a level slightly returned from the level of the immediately preceding peak. Hence, the variation in pulse detection delay is suppressed drastically, and the pulse widths of the transmitted pulse signal (D_TX) are accurately reflected to the pulse widths of the received pulse signal (D_RX). As a result, the influence due to the deformation of the signal waveform in the transmission line is excluded. For example, even if a simple serial data sequence is transmitted and received, data can be transferred accurately. Since the pulses (pulse widths) on the transmission side can be reproduced accurately from a received waveform having been significantly distorted, even when inexpensive base band communication is used, communication can be carried out at a speed higher than that attained conventionally or over a distance longer that attained conventionally.

Embodiment 2

A timing detection device according to Embodiment 2 will be described below.

Although the timing detection device 1 according to Embodiment 1 operates precisely, the timing detection device 1 has, for example, two peak hold circuits and two comparators, thereby being complicated and high in cost. A timing detection device according to Embodiment 2 accomplishes an operation similar to that of the timing detection device 1 according to Embodiment 1 by using a circuit simpler than that of the timing detection device 1.

Figure 4:
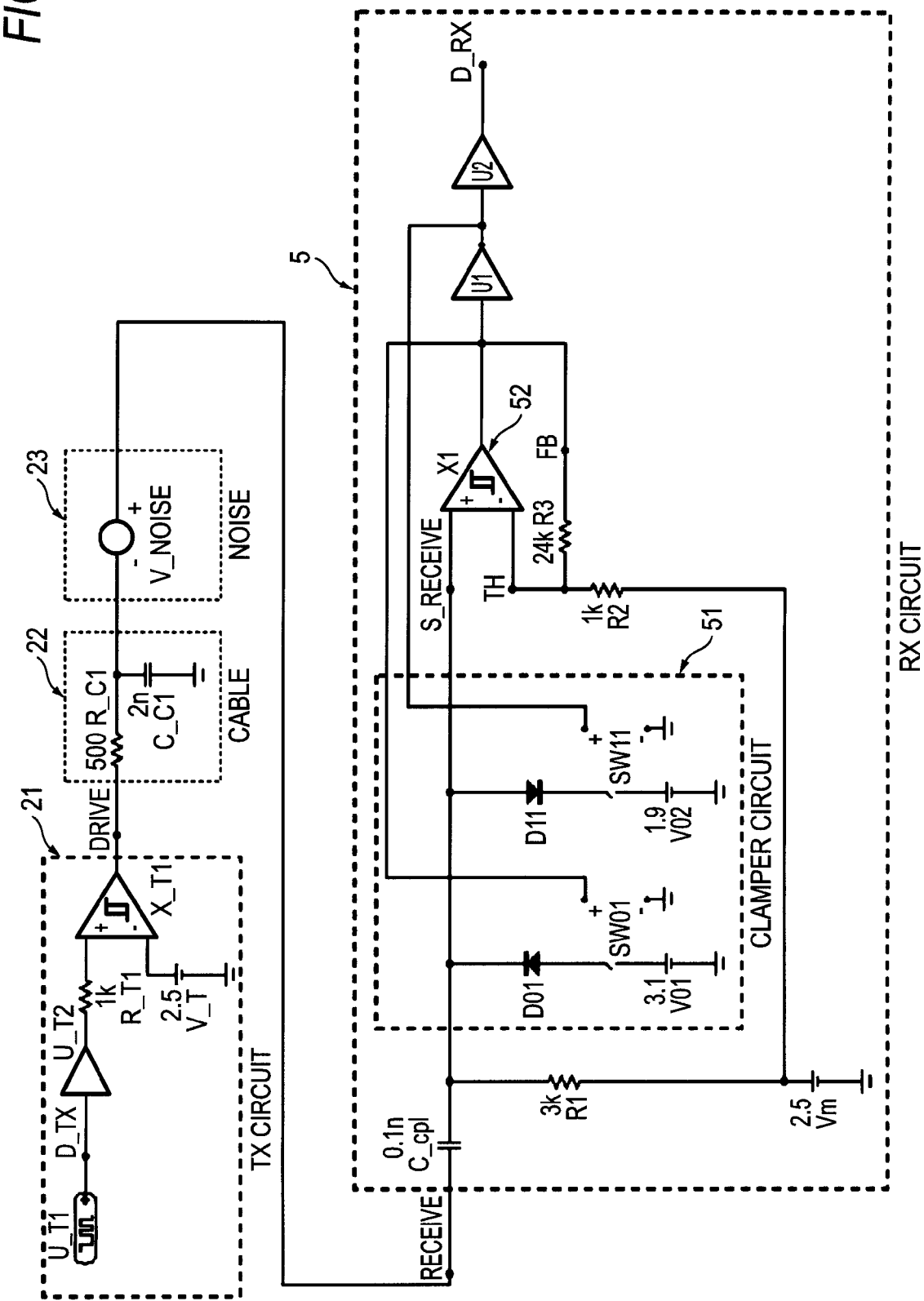
FIG. 4 is a view showing the configuration of a timing detection device according to Embodiment 2.

FIG. 4 is a view showing the configuration of the timing detection device according to Embodiment 2.

As shown in FIG. 4, in a timing detection device 5 according to this embodiment, the input signal voltage (Receive) is not input directly to a comparator 52, but the DC offset thereof is cut off using a coupling capacitor C_cpI. A clamper circuit 51 is used to hold the voltage (S_Receive) inside the coupling capacitor C_cpI at around the center potential (2.5 V) of the amplitude of the voltage. In the case that the clamp potential is 2.5 V, when the forward voltage (Vf) of the diodes of the clamper circuit 51 is constant, 0.6 V, for example, the potentials (V01 and V02) inside the clamper circuit 51 should only be set to 2.5±0.6 V.

Furthermore, the voltage limiting direction of the clamper circuit 51 is switched by controlling a switch SW01 using a feedback signal voltage (FB) from the comparator 52 and by controlling a switch SW11 using the inverted output of the comparator 52. Hence, when the timing detection device detects the rising edge of a pulse of a voltage, the clamper circuit 51 operates so as to limit the voltage in only the voltage falling direction of the voltage, and when the timing detection device detects the falling edge of the pulse of the voltage, the clamper circuit 51 operates so as to limit the voltage in only the voltage rising direction.

Moreover, switching is performed between the threshold level (TH) in the case of detecting the rising edge of a pulse and the threshold level (TH) in the case of detecting the falling edge of the pulse by applying positive feedback from the output terminal to the positive input terminal of the comparator 52.

Figure 5:
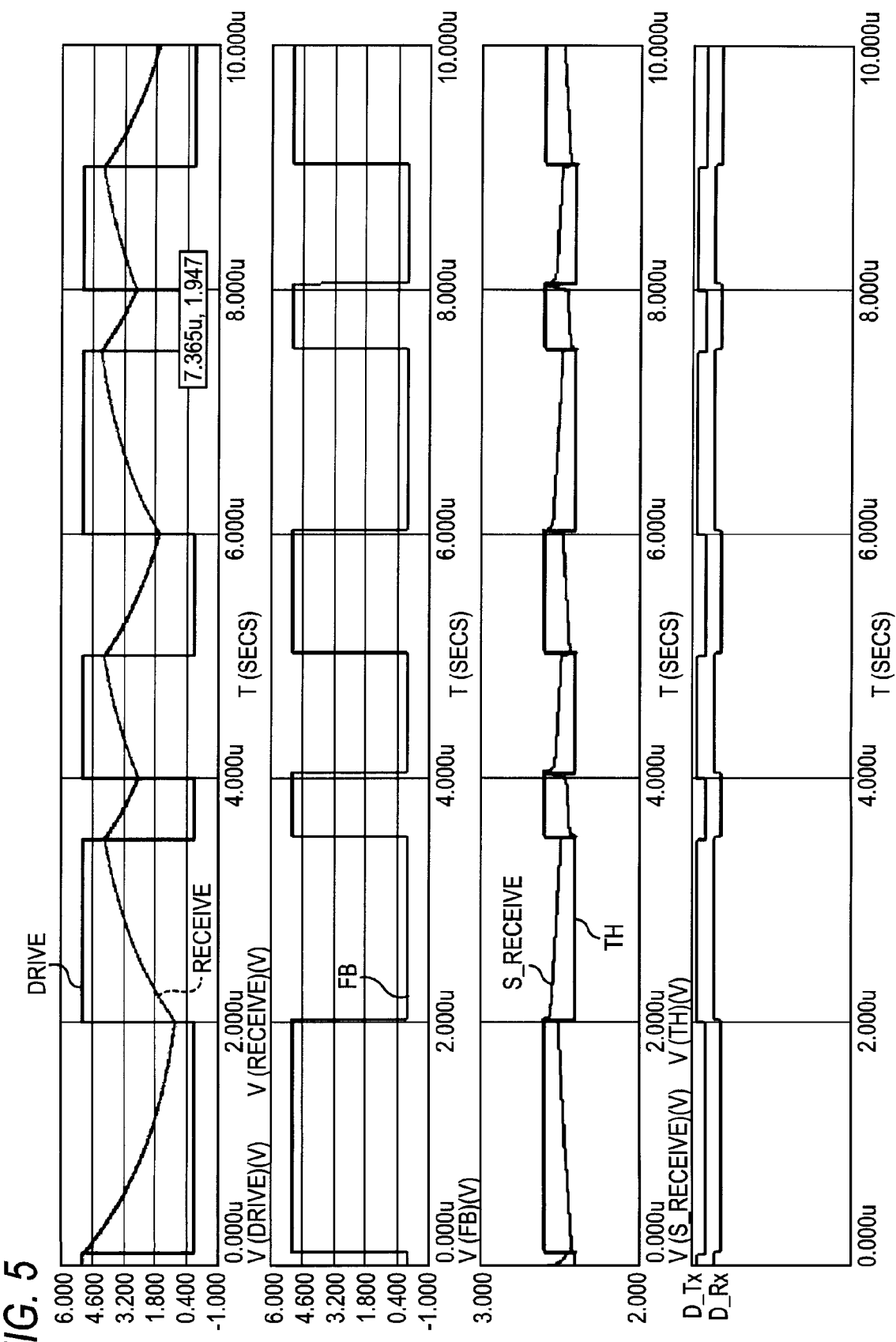
FIG. 5 is a graph showing voltages at various portions of the circuit of the timing detection device according to the Embodiment 2.

FIG. 5 is a graph showing voltages at various portions of the circuit of the timing detection device 5.

As shown in FIG. 5, even if the input signal voltage (Receive) changes, the voltage (S_Receive) inside the coupling capacitor C_cpI is clamped at approximately 2.5 V by the operation of the clamper circuit 51. In the case that the input signal voltage (Receive) transits in a direction opposite to the clamping direction, the voltage (S_Receive) changes promptly and reaches the positive terminal voltage of the comparator 52. In this circuit, the voltage obtained by dividing the output voltage of the comparator 52 by the resistance of a resistor R2 and the resistance of a resistor R3 determines the difference between the peak value and the threshold voltage (TH).

When the voltage (S_Receive) reaches the threshold level (TH), the output of the comparator 52 is switched, whereby the received pulse signal (D_RX) is switched. Since the received pulse signal (D_RX) is switched in a short time in response to the switching of the transmitted pulse signal (D_TX), the pulse widths of the transmitted pulse signal (D_TX) are accurately reflected to the pulse widths of the received pulse signal (D_RX).

As described above, in the timing detection device 5 according to Embodiment 2, the voltage variation width inside the capacitor C_cpI is suppressed by extracting the change of the input signal voltage (Receive) as the voltage (S_Receive), whereby the circuit of the timing detection device 5 is simplified. The capacitor C_cpI is provided with a function of absorbing the DC offsets of the input signal voltage (Receive) and the voltage (Drive) depending on the amplitude of the input signal voltage (Receive).

Embodiment 3

A timing detection device according to Embodiment 3 will be described below.

In this embodiment, even when the level of a signal is low, the pulses of the signal can be detected securely. The timing detection device according to Embodiment 2 is suited in the case that the waveform of the signal is large to the extent that the forward voltage Vf of the diodes of the clamper circuit is regarded as constant. However, in the case that the level of the signal is low, a problem occurs in the temperature coefficient of the forward voltage Vf, for example. The timing detection device according to Embodiment 3 is intended to make up for this kind of shortcoming so as to be usable for receiving pulses having low signal levels, in spite of the simple configuration of the device.

Figure 6:
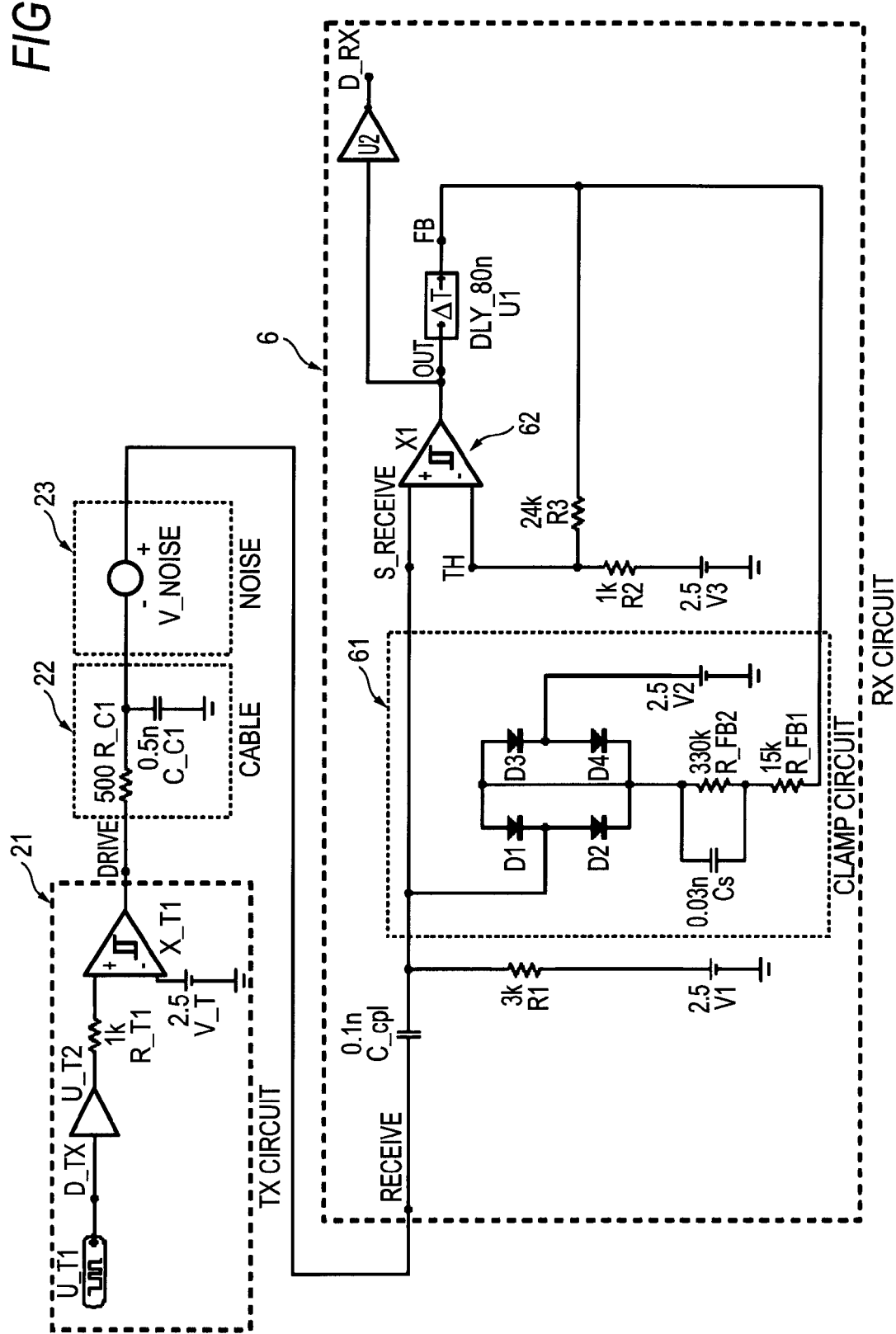
FIG. 6 is a view showing the configuration of a timing detection device according to Embodiment 3.

FIG. 6 is a view showing the configuration of a timing detection device 6 according to Embodiment 3. In addition, FIG. 7 is a view showing the operation of the timing detection device 6, showing the voltages at various portions of the circuit thereof and the currents flowing through a capacitor Cs and a resistor R_FB2.

As shown in FIG. 6, the timing detection device 6 according to Embodiment 3 is equipped with a clamper circuit 61 and a comparator 62. The capacitor C_cpI thereof functions as in the case of Embodiment 2.

As shown in FIG. 6, the clamper circuit 61 of the timing detection device 6 is equipped with a diode switch formed of a diode D1, a diode D2, a diode D3 and a diode D4. In this circuit, in the case that the diode D1 is balanced with the diode D3 and that the diode D2 is balanced with the diode D4, the direction of the clamp current of the clamper circuit 61 is switched depending on a slight difference between the middle point between the diode D1 and the diode D2, i.e., the voltage (S_Receive), and the middle point between the diode D3 and the diode D4, i.e., 2.5 V. In other words, the clamper circuit 61 operates so that the voltage (S_Receive) is precisely controlled to 2.5 V.

Figure 7:
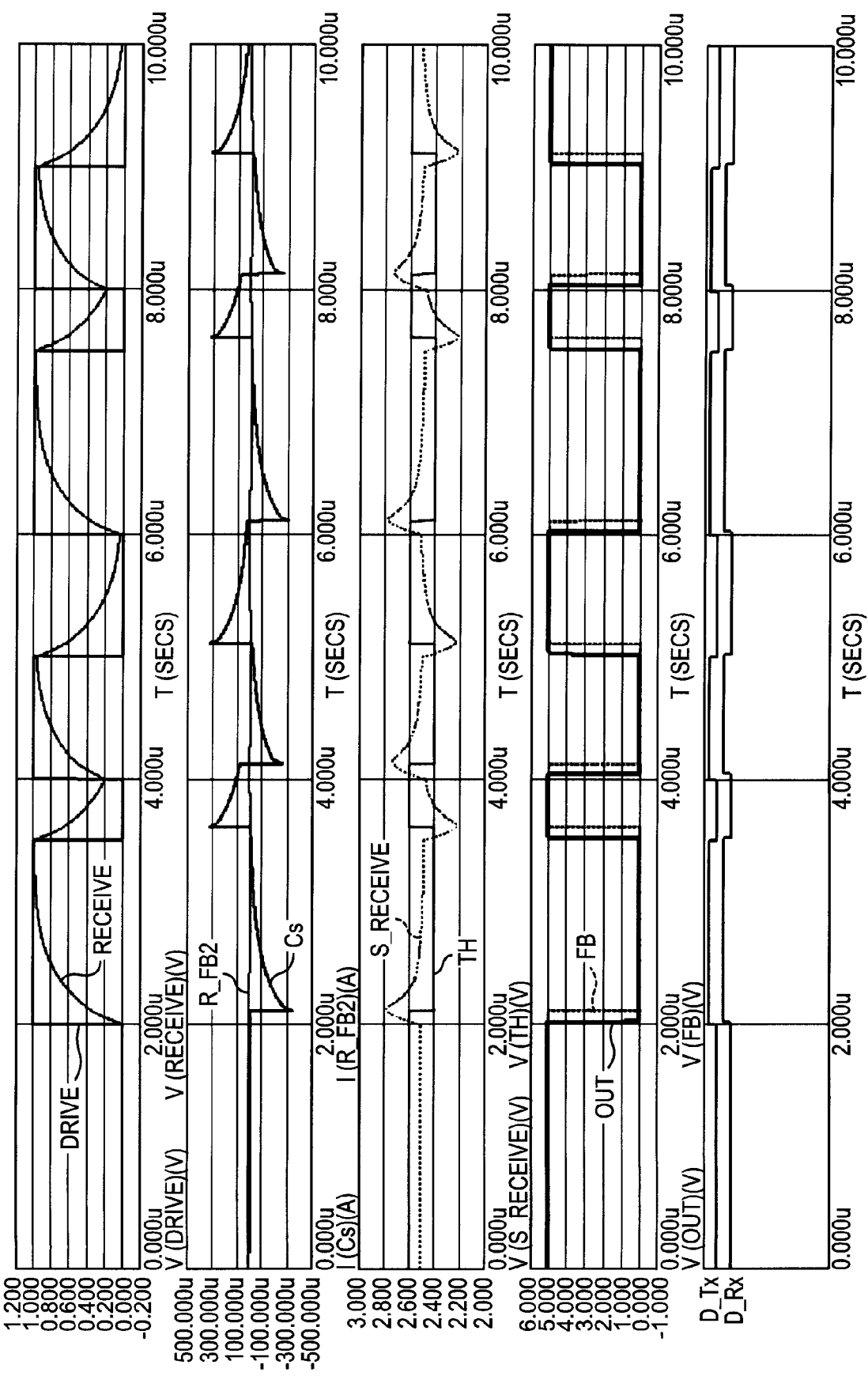
FIG. 7 is a view showing voltages and currents at various portions of the circuits in the timing detection device according to the Embodiment 3.

As shown in FIGS. 6 and 7, the clamper circuit 61 operates only in one direction, and the direction at the time when the rising edge is detected is opposite to the direction at the time when the falling edge is detected, as in the case of Embodiment 2. The operation switching of the clamper circuit 61 is based on a feedback signal voltage (FB). The feedback signal voltage (FB) is obtained by giving a delay due to a delay circuit U1 to the output signal (Out) of the comparator 62. This delays the time at which a speeding-up circuit formed of a capacitor Cs and resistors R_FB1 and R_FB2 operates, thereby being effective in preventing excessive compensation for the change in the voltage (S_Receive). Furthermore, the threshold level (TH) is generated by dividing the feedback signal voltage (FB) by the resistance of a resistor R2 and the resistance of a resistor R3 and is switched depending on the switching of the feedback signal voltage (FB). The delay circuit U1 herein operates as a delay unit.

As shown in FIG. 7, in the timing detection device 6 according to this embodiment, even in the case that the amplitude of the input signal voltage (Receive) is small (in the case that the amplitude is approximately 1 V, for example), the difference between the rising timing of the transmitted pulse signal (D_TX) and the rising timing of the received pulse signal (D_RX) is constant, and the difference between the falling timing of the transmitted pulse signal (D_TX) and the falling timing of the received pulse signal (D_RX) is constant. As a result, the pulse widths can be detected accurately.

Figure 8:
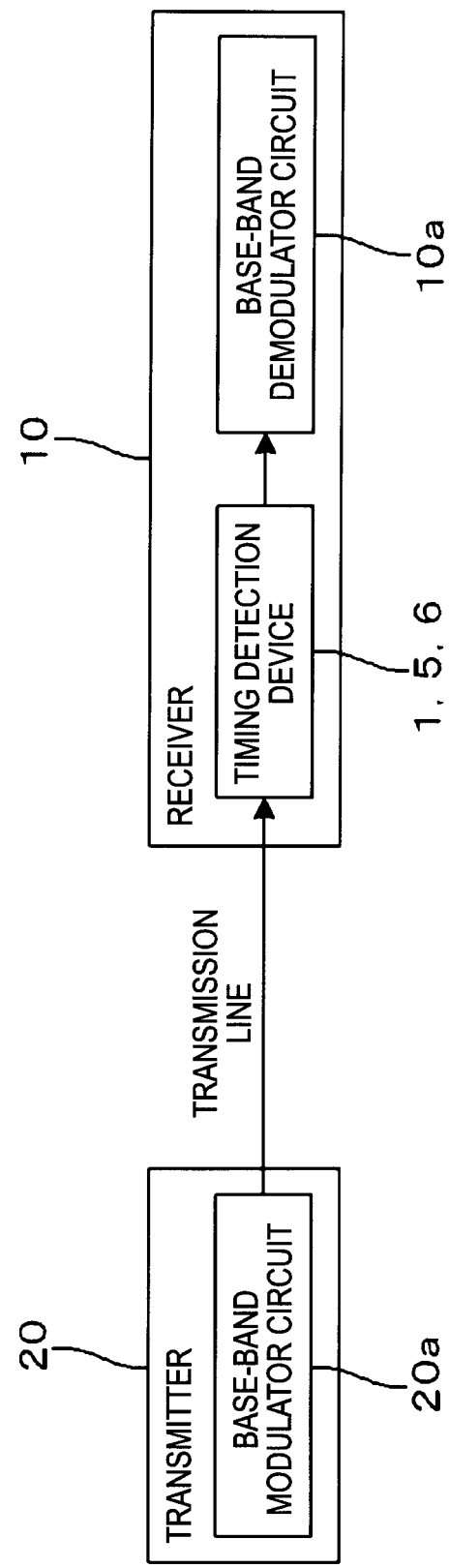
FIG. 8 is a view showing the configuration of a receiver incorporating the timing detection device according to the present invention.
Figure 9A:
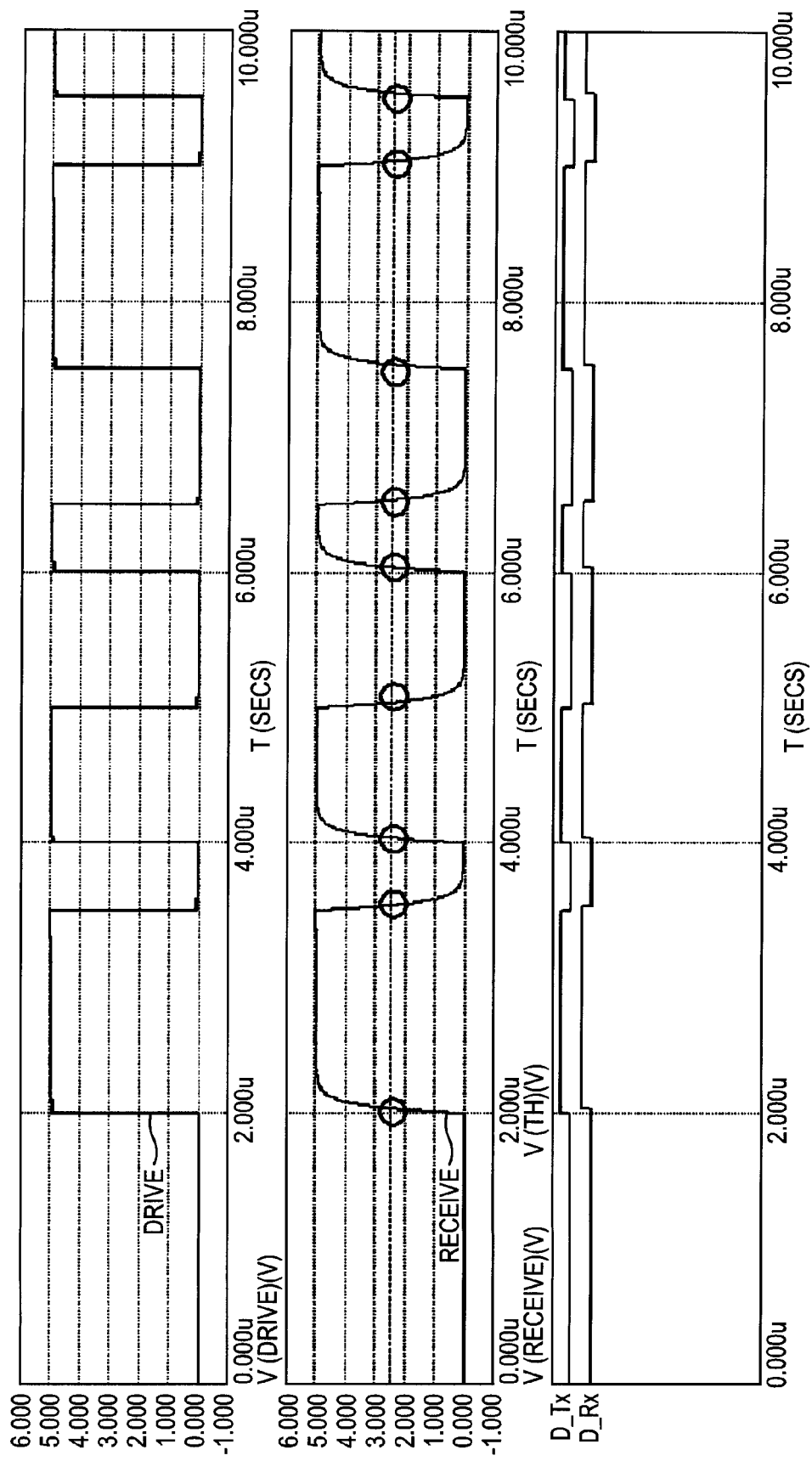

FIG. 8 is a view showing the configuration of a receiver incorporating the timing detection device according to the present invention. As shown in FIG. 8, a receiver 10 is equipped with the timing detection device 1, 5 or 6 according to Embodiment 1, 2 or 3 and a base-band demodulator circuit 10a for performing demodulation on the basis of the received pulse signal (D_RX) output from the timing detection device 1, 5 or 6. The signal output from the base-band modulator circuit 20a of a transmitter 20 is transferred to the receiver 10 via a transmission line and demodulated by the base-band demodulator circuit 10a.

The applicable scope of the present invention is not limited to the above-mentioned embodiments. The present invention is widely applicable to timing detection devices for detecting the timing at which the value of a received signal is switched on the basis of the received signal.

What is claimed is:
1. A timing detection device comprising:
a draw back amount acquiring unit configured to acquire a draw back amount of a received signal with respect to a peak value of the signal; and
a detecting unit configured to detect the timing at which the draw back amount acquired by the draw back amount acquiring unit has exceeded a constant value as the timing at which a value of the signal is switched, wherein the draw back amount acquiring unit holds a minimum value and a maximum value of an immediately preceding waveform of the signal, wherein the draw back amount acquiring unit includes an extracting circuit configured to extract a movement of the signal, wherein the detecting unit detects the timing at which the movement extracted by the extracting circuit has exceeded the constant value as the timing at which the value of the signal is switched, and wherein the extracting circuit includes a clamper circuit configured to cancel a DC offset of the signal and extract the movement and a capacitor configured to absorb the DC offset canceled by the clamper circuit.

2. The timing detection device according to claim 1, further comprising:

a delay unit configured to delay a restart time of a detection operation of the detecting unit by the time when a constant time passes from the time when the timing at which the value of the signal is switched is detected by the detecting unit.

3. The timing detection device according to claim 1, wherein the draw back amount acquiring unit includes a peak hold circuit configured to hold the peak value, and wherein the detecting unit detects the timing at which a difference between the peak value held by the peak hold circuit and the value of the signal has exceeded the constant value as the timing at which the value of the signal is switched.

4. The timing detection device according to claim 2, wherein the draw back amount acquiring unit includes a peak hold circuit configured to hold the peak value, and wherein the detecting unit detects the timing at which a difference between the peak value held by the peak hold circuit and the value of the signal has exceeded the constant value as the timing at which the value of the signal is switched.

5. The timing detection device according to claim 2, wherein the draw back amount acquiring unit include an extracting circuit configured to extract a movement of the signal, and wherein the detecting unit detects the timing at which the movement extracted by the extracting circuit has exceeded the constant value as the timing at which the value of the signal is switched.

* * * * *